United States Patent
Toyoda et al.

(10) Patent No.: US 9,846,931 B2
(45) Date of Patent: Dec. 19, 2017

(54) PATTERN SENSING DEVICE AND SEMICONDUCTOR SENSING SYSTEM

(71) Applicant: Hitachi High-Technologies Corporation, Minato-ku, Tokyo (JP)

(72) Inventors: Yasutaka Toyoda, Tokyo (JP); Hiroyuki Shindo, Tokyo (JP); Yoshihiro Ota, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 8 days.

(21) Appl. No.: 14/379,425

(22) PCT Filed: Feb. 18, 2013

(86) PCT No.: PCT/JP2013/053793
§ 371 (c)(1),
(2) Date: Aug. 18, 2014

(87) PCT Pub. No.: WO2013/140907
PCT Pub. Date: Sep. 26, 2013

(65) Prior Publication Data
US 2015/0016709 A1    Jan. 15, 2015

(30) Foreign Application Priority Data
Mar. 19, 2012    (JP) .................. 2012-061373

(51) Int. Cl.
*G06K 9/00*    (2006.01)
*G06T 7/00*    (2017.01)
(Continued)

(52) U.S. Cl.
CPC ............ *G06T 7/001* (2013.01); *G06K 9/6255* (2013.01); *G06T 7/0008* (2013.01);
(Continued)

(58) Field of Classification Search
CPC .............. G01B 2210/56; G06K 9/6255; G06T 2207/10061; G06T 2207/30148;
(Continued)

(56) References Cited

U.S. PATENT DOCUMENTS 8,019,161 B2    9/2011    Morokuma et al.
8,045,785 B2    10/2011   Kitamura et al.
(Continued)

FOREIGN PATENT DOCUMENTS

| JP | 2001-33231 A | 2/2001 |
|----|--------------|--------|
| JP | 2004-163420 A | 6/2004 |

(Continued)

OTHER PUBLICATIONS

Corresponding International Search Report dated May 21, 2013 with English Translation (five (5) pages).
(Continued)

*Primary Examiner* — Manuchehr Rahmjoo
(74) *Attorney, Agent, or Firm* — Crowell & Moring LLP

(57) ABSTRACT

An object of the invention is to provide a pattern measuring device for generating appropriate reference pattern data while suppressing an increase in the manufacturing cost that would occur when manufacturing conditions are finely changed. A pattern measuring device has an arithmetic processing unit for measuring a pattern formed on a sample. The arithmetic processing unit, on the basis of signals obtained with a charged particle beam device, acquires or generates image data or contour line data on a plurality of circuit patterns created under different manufacturing conditions of a manufacturing apparatus, and generates reference data to be used for measurement of a circuit pattern from the image data or contour line data.

15 Claims, 10 Drawing Sheets

(51) Int. Cl.
*H01L 21/66* (2006.01)
*H01J 37/24* (2006.01)
*H01J 37/26* (2006.01)
*H01J 37/22* (2006.01)
*G06K 9/62* (2006.01)

(52) U.S. Cl.
CPC ............ *H01J 37/222* (2013.01); *H01J 37/24* (2013.01); *H01J 37/26* (2013.01); *H01L 22/12* (2013.01); *G01B 2210/56* (2013.01); *G06T 2207/10061* (2013.01); *G06T 2207/30148* (2013.01); *H01J 2237/24578* (2013.01); *H01J 2237/28* (2013.01); *H01J 2237/2817* (2013.01)

(58) Field of Classification Search
CPC ................. G06T 7/0008; G06T 7/001; H01J 2237/24578; H01J 2237/28; H01J 2237/2817; H01J 37/222; H01J 37/24; H01J 37/26; H01L 22/12
USPC ......................................................... 382/149
See application file for complete search history.

(56) References Cited

U.S. PATENT DOCUMENTS

| 8,077,962 | B2 | 12/2011 | Toyoda et al. | |
| 8,547,429 | B2 | 10/2013 | Honda et al. | |
| 2006/0245636 | A1* | 11/2006 | Kitamura | G06K 9/00 382/149 |
| 2009/0231424 | A1* | 9/2009 | Honda | G06T 7/0006 348/87 |
| 2013/0070078 | A1* | 3/2013 | Takagi | G06T 7/001 348/80 |
| 2013/0326439 | A1* | 12/2013 | Matsuoka | G01B 15/04 716/55 |

FOREIGN PATENT DOCUMENTS

| JP | 2007-184364 A | 7/2007 |
| JP | 2007-248087 A | 9/2007 |
| JP | 2009-194051 A | 8/2009 |
| JP | 2009-206453 A | 9/2009 |
| JP | 2011-54859 A | 3/2011 |
| JP | 2011-141133 A | 7/2011 |
| JP | 2011-179819 A | 9/2011 |

OTHER PUBLICATIONS

Japanese-language Written Opinion dated May 21, 2013 (PCT/ISA/237) (three (3) pages).

* cited by examiner (a)   (b)

PATTERN SENSING DEVICE AND SEMICONDUCTOR SENSING SYSTEM

TECHNICAL FIELD

The present invention relates to a pattern measuring device and a semiconductor measuring system. In particular, the present invention relates to a device and a system for deriving a measured value of a circuit pattern by measuring and comparing the dimensions of circuit patterns of an electronic device and the dimensions of a reference pattern.

BACKGROUND ART

In recent years, semiconductors have been reduced in size and increased in the number of layers as well as the complexity of logics. Thus, semiconductors have become quite difficult to manufacture. Consequently, defects originating from a manufacturing process are likely to occur frequently, and it has thus become important to correctly inspect such defects. A review SEM (Scanning Electron Microscope) for reviewing defects on a sample and a CD-SEM (Critical Dimension-SEM) for measuring the dimensions of a pattern are used to perform detailed inspection of such defects. Such SEM inspection devices are adapted to inspect circuit patterns corresponding to inspection coordinates that are based on an optical simulation or inspection coordinates that are based on an inspection result of an optical inspection apparatus.

Comparison between the shapes of a circuit pattern and a reference pattern is conducted in accordance with the following procedures. First, an inspection operator defines a circuit pattern with a preferable shape as a reference pattern. For the reference pattern, a designed pattern, a simulation pattern generated through an optical simulation, a golden pattern selected by an inspection operator from among manufactured circuit patterns, or the like is used. Next, the shape of a circuit pattern is extracted from a captured image using an edge detection process or the like. Then, the reference pattern and the circuit pattern are overlaid one on top of the other. Such overlaying is performed through manual adjustment or through automatic adjustment using pattern matching.

Various inspection methods have been proposed, but for a process of manufacturing a semiconductor with a thickness of 65 nm or less, it has become more common to apply a method of quantifying the amount of shape deformation of a circuit pattern with respect to a reference pattern by comparing the shape of the circuit pattern with the shape of the reference pattern with a view to correctly grasp the condition of a patterned shape with the presence of the optical proximity effect.

The shape of a circuit pattern would deform variously in response to changes in the manufacturing conditions of a semiconductor. Patent Literature 1 discloses, with a view to correctly grasp the degree of such deformation, using a circuit pattern, which is obtained by deforming a design pattern so as to conform to a wafer pattern, as a reference pattern, and measuring the gaps between edges of a circuit pattern to be inspected and those of the reference pattern, and then detecting a portion of the pattern whose edge distance is over a tolerable distance as a defect of the circuit pattern.

Patent Literature 2 discloses using a design pattern as a reference pattern, setting a measurement region in a two-dimensional region including inspection coordinates, and thoroughly measuring the distances between edges of the reference pattern and corresponding edges of a circuit pattern in the measurement region at predetermined intervals, and then averaging the plurality of measured values obtained from the measurement region so as to measure the shape deformation with respect to the reference pattern.

Patent Literature 3 discloses a measurement method that includes, using the average shape of a plurality of circuit patterns formed on a wafer as a reference pattern, thoroughly measuring the distances between edges of the reference pattern and corresponding edges of a circuit pattern at predetermined intervals, and determining the statistical value of the distances obtained from the measurement region as the amount of shape deformation.

CITATION LIST

Patent Literature

Patent Literature 1: JP 2004-163420 A (Counterpart: U.S. Pat. No. 8,045,785)

Patent Literature 2: JP 2007-248087 A (Counterpart: U.S. Pat. No. 8,019,161)

Patent Literature 3: JP 2009-194051 A (Counterpart: U.S. Pat. No. 8,077,962)

SUMMARY OF INVENTION

Technical Problem

In some of the wafer manufacturing steps, it is required to inspect how much the shape of a circuit pattern to be inspected is deformed as compared to the shape of a circuit pattern that is manufactured under an optimal condition (hereinafter referred to as a best condition) for manufacturing the circuit pattern.

It should be noted that the best condition is typically determined by statistically analyzing the dimension values of a plurality of circuit patterns that have been manufactured by changing the focus amount and dose amount of an exposure apparatus in stages. To realize the aforementioned inspection, it is necessary to compare a circuit pattern to be inspected with a circuit pattern, which has been created under the best condition as determined through statistical analysis, as a reference pattern.

However, the best condition obtained through analysis is not necessarily the same as the manufacturing conditions of the circuit patterns used to determine the best condition. Therefore, even when a golden pattern is used as a reference pattern for inspection, correct evaluation may not be performed. Although it may be possible to create a pattern under a condition that is close to the best condition by manufacturing a wafer again, such a process is quite costly and is difficult to realize. Further, as a simulation involves errors, even when a circuit pattern of the best condition is created through a simulation and is compared with a circuit pattern to be inspected, it would be difficult to inspect the correct amount of shape deformation due to the influence of errors contained in the simulation results. Further, even when a design pattern is used as a reference pattern, it would be difficult to inspect the correct amount of shape deformation as the shapes of a circuit pattern to be inspected and the reference pattern originally differ and such shape difference is reflected in the measured value.

Although it would be desirable to create a reference pattern from an image of the actual pattern that has been created under as an appropriate condition as possible, it would be difficult to find out a best condition in the stage of selecting the manufacturing conditions of a manufacturing apparatus as described above. Each of the methods disclosed in Patent Literature 1 to 3 is insufficient in accuracy to create an appropriate reference pattern.

The present invention proposes a pattern measuring device and a semiconductor measuring device having an objective of generating appropriate reference pattern data while suppressing an increase in the manufacturing cost that would occur when manufacturing conditions are finely changed.

Solution to Problem

As an aspect to achieve the above object, there is proposed a pattern measuring device that includes an arithmetic processing unit configured to measure a pattern formed on a sample on the basis of an image obtained with a charged particle beam device. The arithmetic processing unit, on the basis of signals obtained with the charged particle beam device, acquires or generates image data or contour line data on a plurality of circuit patterns created under different manufacturing conditions of a manufacturing apparatus, and generates reference data to be used for measurement of a circuit pattern from the image data or the contour line data. In addition, as an aspect to achieve the above object, there is proposed a semiconductor measuring system.

Advantageous Effects of Invention

According to the aforementioned configuration, it is possible to generate appropriate reference pattern data while suppressing an increase in the manufacturing cost that would occur when manufacturing conditions are finely changed.

DESCRIPTION OF EMBODIMENTS

Figure 1:
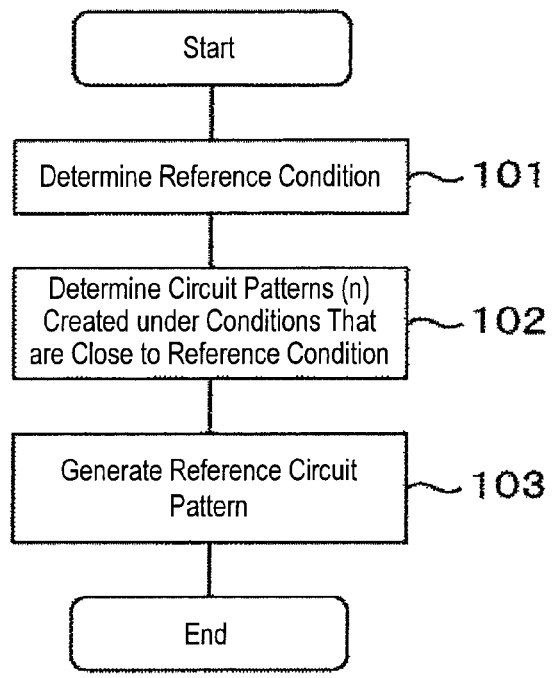
FIG. 1 is a flowchart showing the steps of generating a reference circuit pattern.

Hereinafter, description will be made of a semiconductor measuring device for, by performing comparison between a circuit pattern of an electronic device and a reference pattern (which includes performing dimension measurement, shape difference evaluation, area difference evaluation, and the like of the two patterns), generating a measured value of the circuit pattern, the semiconductor measuring device being adapted to, when creating a reference pattern (i.e., shape reference data), generate a reference pattern from image data on a plurality of patterns created under conditions that are close to a best manufacturing condition or from contour line data on the plurality of patterns.

Further, in the following embodiment, an example will be described in which if the circuit pattern is defective is determined by comparing the measured value with a predetermined threshold.

An example will also be described in which image data or contour line data of a condition that is close to the best condition of the manufacturing apparatus is generated on the basis of manufacturing reference data on a circuit pattern of an electronic device and data on a plurality of circuit patterns of the electronic device created under different manufacturing conditions.

An example will also be described in which the manufacturing reference data is determined by measuring dimension values of circuit patterns of an electronic device created under a plurality of different manufacturing conditions and analyzing the measured dimension values.

An example will also be described in which the manufacturing reference data is determined by analyzing a shape error value between each of circuit patterns of an electronic device created under a plurality of different manufacturing conditions and a design pattern of the electronic device.

An example will also be described in which the dimensions of circuit patterns of an electronic device created under a plurality of different manufacturing conditions are measured.

An example will also be described in which the shape error value is measured by comparing each of circuit patterns of an electronic device created under a plurality of different manufacturing conditions with a design pattern of the electronic device, simulation pattern, or a pattern extracted from a captured image of a circuit pattern.

An example will also be described in which the design pattern of the electronic device is analyzed and an area for which the shape error value is to be measured is identified by excluding an area around a corner.

An example will also be described in which when shape reference data is generated, an edge point of the shape reference data is determined by performing an operation of interpolating edge points of the plurality of circuit patterns on the basis of an amount of difference between the manufacturing reference data and the manufacturing condition.

An example will also be described in which a shape errors amount is measured on the basis of comparison between the shape reference data and shape data on each of circuit patterns of an electronic device manufactured under a plurality of manufacturing conditions.

An example will also be described in which a non-defective circuit pattern is identified by comparing the shape error amount and a predetermined tolerable error amount.

An example will also be described in which a process window of an exposure apparatus is identified on the basis of the manufacturing condition of the non-defective pattern.

An example of a scanning electron microscope as an image forming device will also be described that forms image data on the basis of electrons obtained by scanning an electronic device with an electron beam.

An example of an image display device will also be described that has a screen for displaying data on at least one of the shape reference data, the circuit pattern, the measured value of the shape error amount, the determination result, or the identified process window.

An example will also be described in which the shape reference data is formed by two or more edge groups having different edge directions.

According to the embodiment described below, it is possible to, by using manufacturing reference data on a circuit pattern of an electronic device and a shape reference data generated from a plurality of circuit patterns of the electronic device created under different manufacturing conditions for measurement of a circuit pattern, correctly measure and quantify the amount of shape deformation of a circuit pattern for which the manufacturing condition has changed with respect to the manufacturing reference.

Embodiment 1

Hereinafter, a specific example of a pattern measuring device and a semiconductor measuring system will be described with reference to the drawings.

Figure 2:
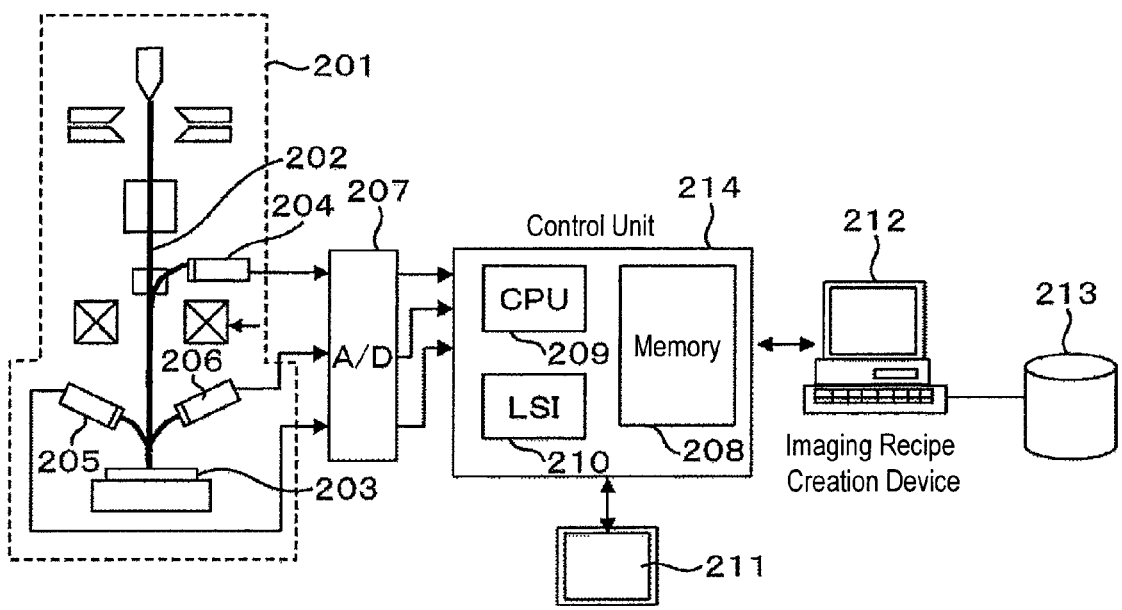
FIG. 2 is a diagram showing an overview of a semiconductor measuring system.

FIG. 2 is a diagram showing an overview of the semiconductor measuring system. The semiconductor measuring system includes a scanning electron microscope 201 (hereinafter referred to as SEM) for acquiring image data on a circuit pattern, and a control unit 214 for inspecting the circuit pattern by analyzing the image data.

The SEM 201 irradiates a sample 203, such as a wafer on which an electronic device is manufactured, with an electron beam 202. Then, electrons emitted from the sample 203 are captured with a secondary electron detector 204 and reflected electron detectors 205 and 206, and are then converted into digital signals with an A/D converter 207. The digital signals are input to the control unit 214 and are stored in a memory 208. Then, image processing in accordance with the intended purpose is performed by a CPU 209 and image processing hardware 210 such as ASIC or FPGA, so that the circuit pattern is inspected.

Further, the control unit 214 is connected to a display 212 with an input means, and has a function of a GUI (Graphical User Interface) or the like for displaying an image, inspection results, and the like to a user. It should be noted that some or all of control performed by the control unit 214 can also be allocated to and performed by an electronic computer or the like that has mounted thereon a CPU and a memory capable of storing images. The control unit 214 is connected to an imaging recipe creation device 212 for creating an imaging recipe, which includes the coordinates of an electronic device needed for inspection, a pattern matching template to be used for determining the inspection position, imaging conditions, and the like, via a network or a bus or the like, either manually or by using design data 213 of the electronic device.

Figure 12:
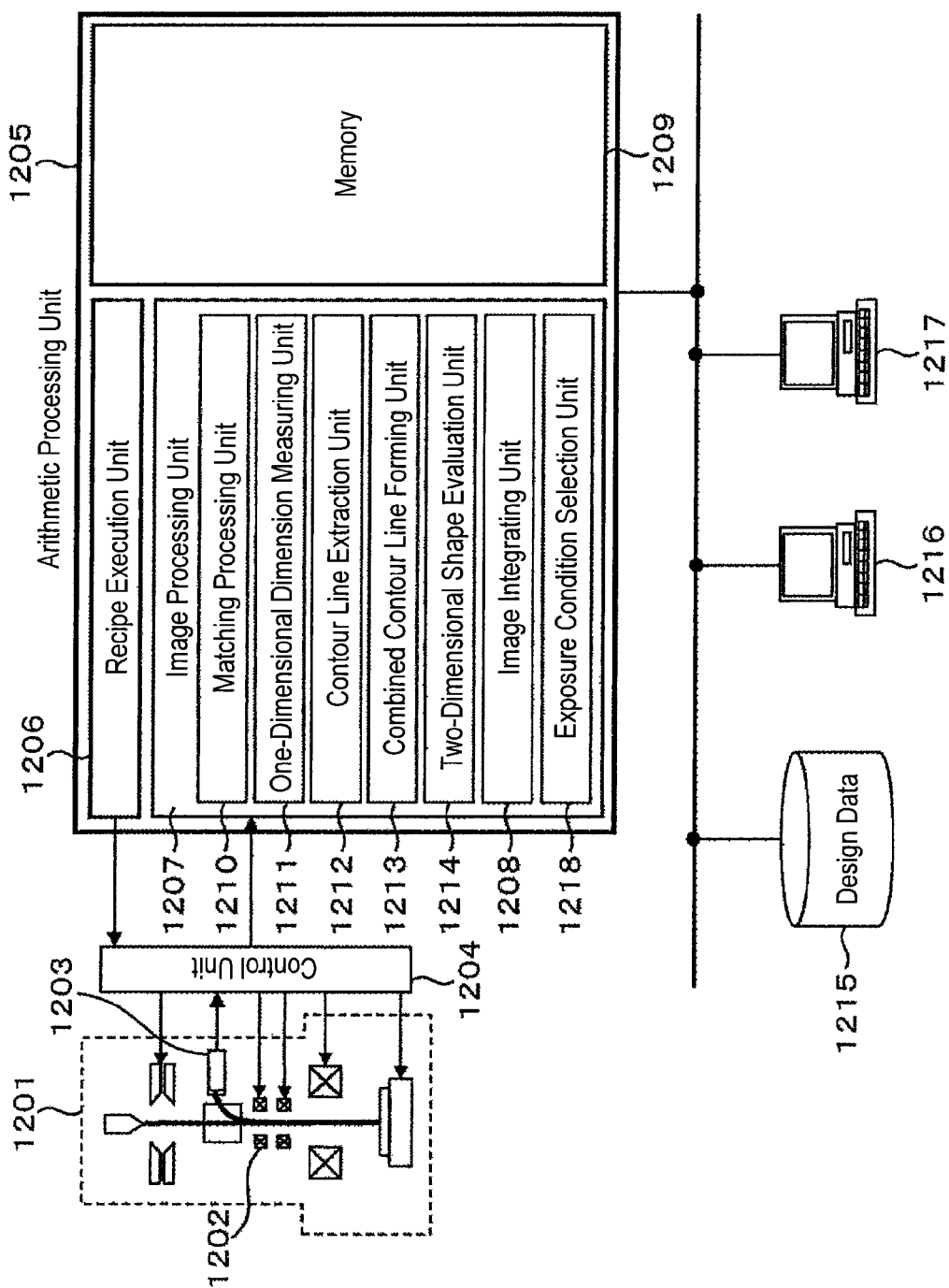
FIG. 12 is a diagram showing an exemplary semiconductor measuring system.

FIG. 12 is a diagram showing an arithmetic processing unit incorporated in the control unit 214 in more detail. The semiconductor measuring system exemplarily shown in FIG. 12 includes a scanning electron microscope main body 1201, a control unit 1204 for controlling the scanning electron microscope main body, an arithmetic processing unit 1205 for transmitting a control signal to the control unit 1204 on the basis of a predetermined operation program (i.e., recipe) and executing dimension measurement or shape evaluation of a pattern from signals (e.g., secondary electrons or backscattered electrons) obtained with the scanning electron microscope, a design data storage medium 1215 having stored therein design data on a semiconductor device, a simulator 1216 for simulating the quality of a pattern on the basis of the design data, and an input/output device 1217 for receiving predetermined semiconductor evaluation conditions and outputting measurement results or process window analysis results.

The arithmetic processing unit 1205 functions as an image processing device for forming a contour line from the obtained image. The control unit 1204, on the basis of an instruction from the recipe execution unit 1206, controls a sample stage and a deflector in the scanning electron microscope main body 1201, and executes positioning of the scan region (i.e., field of view) at a desired position. A scan signal corresponding to the preset magnification and the size of the field of view is supplied from the control unit 1204 to a scan deflector 1202. The scan deflector 1202 changes the size of the field of view (i.e., magnification) to a desired size in response to the supplied signal.

The arithmetic processing unit 1205 includes an image processing unit 1207 for performing image processing on an image that has been obtained by arranging detection signals obtained with a detector 1203 in synchronism with the scanning of the scan deflector 1202. The arithmetic processing unit 1205 has incorporated therein a memory 1209 having stored therein operation programs that are necessary, image data, measurement results, and the like.

In addition, the arithmetic processing unit 1205 includes a matching processing unit 1210 for performing template matching using a template image stored in advance, a one-dimensional dimension measuring unit 1211 for forming a luminance waveform profile on the basis of a detection signal and measuring the dimensions between the peaks of the profile to measure the dimensions of a pattern, a contour line extraction unit 1212 for extracting a contour line from image data as described below, a combined contour line forming unit 1213 for forming a single contour line on the basis of a plurality of contour lines obtained, and a two-dimensional shape evaluation unit 1214 for evaluating a two-dimensional shape using reference pattern data formed by the combined contour line forming unit 1213.

Electrons emitted from a sample are captured with the detector 1203, and are converted into digital signals by the A/D converter incorporated in the control unit 1204. Then, image processing in accordance with the intended purpose is performed by image processing hardware incorporated in the image processing unit 1207, such as CPU, ASIC, or FPGA.

The arithmetic processing unit 1205 is connected to the input/output device 1217, and has a function of a GUI (Graphical User Interface) or the like for displaying images, inspection results, and the like to an operator on a display device provided in the input/output device 1217.

The input/output device 1217 also functions as an imaging recipe creation device for creating an imaging recipe, which includes the coordinates of an electronic device needed for measurement, inspection, and the like, a pattern matching template to be used for determining the inspection position, imaging conditions, and the like, either manually or by using design data stored in the design data storage medium 1215 of the electronic device.

The input/output device 1217 has a template creation unit for cutting out a part of a line drawing image formed on the basis of design data as a template. The template is registered in the memory 1209 as a template for use in template matching of the matching processing unit 1210. Template matching is a method of identifying matching portions between a captured image, which is a positioning target, and the template on the basis of determination of the matching degree using a normalized correlation method or the like. The matching processing unit 1210 identifies a desired position of the captured image on the basis of determination of the matching degree. Although the degree of matching between a template and an image is represented by the term "matching degree" or "similarity" in this embodiment, all of such terms are the same in that they are the indices representing the degree of matching between a template and an image. In addition, the term "non-matching degree" or "dissimilarity" also represents one aspect of similarity.

The image processing unit 1207 also has incorporated therein an image integrating unit 1208 for forming an integrated image by integrating signals obtained with the SEM, and an exposure condition selection unit 1218 for extracting appropriate exposure conditions from a pattern formed by a semiconductor exposure apparatus.

Figure 13:
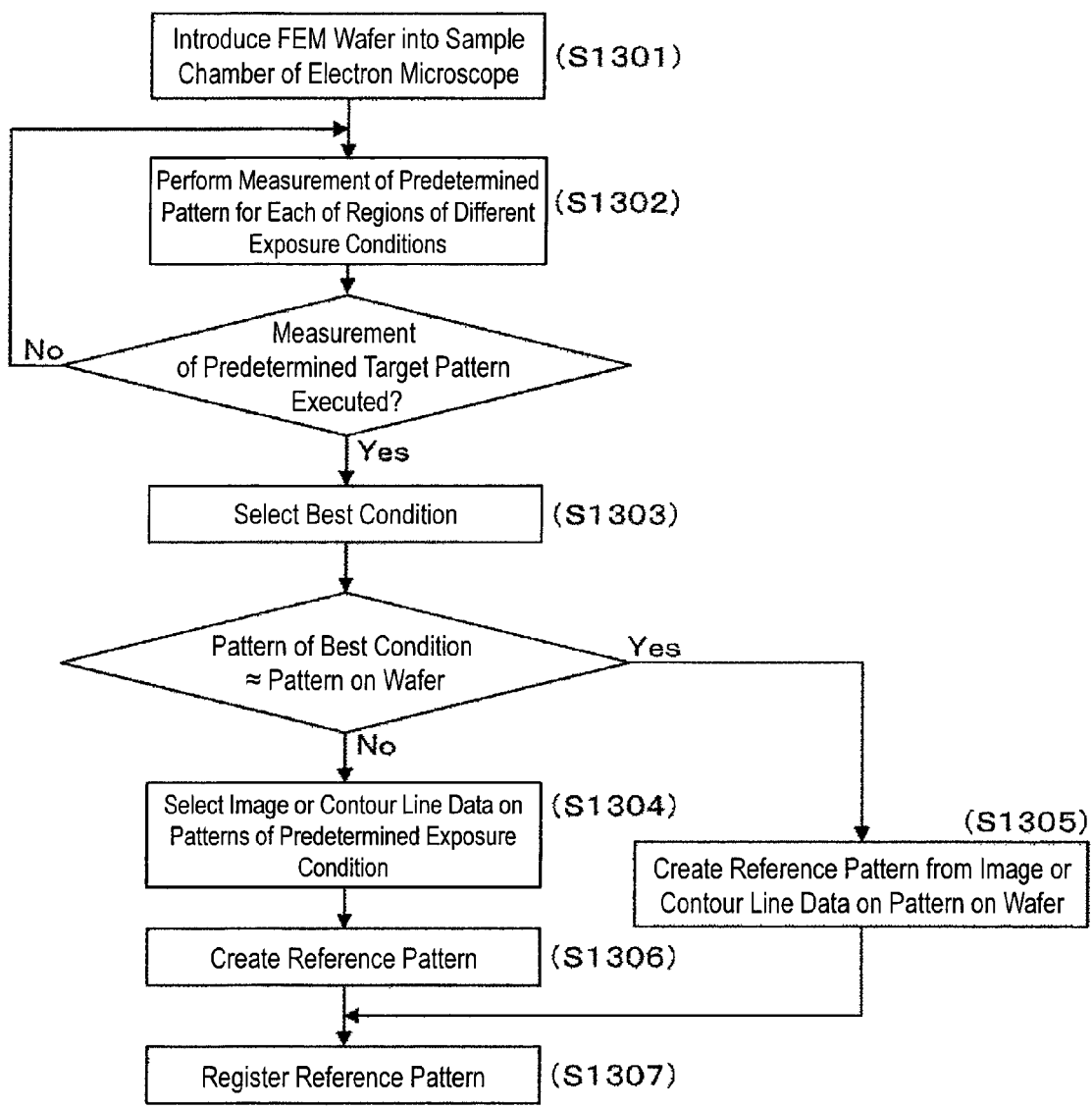
FIG. 13 is a flowchart showing the steps of generating a reference circuit pattern.
Figure 14:
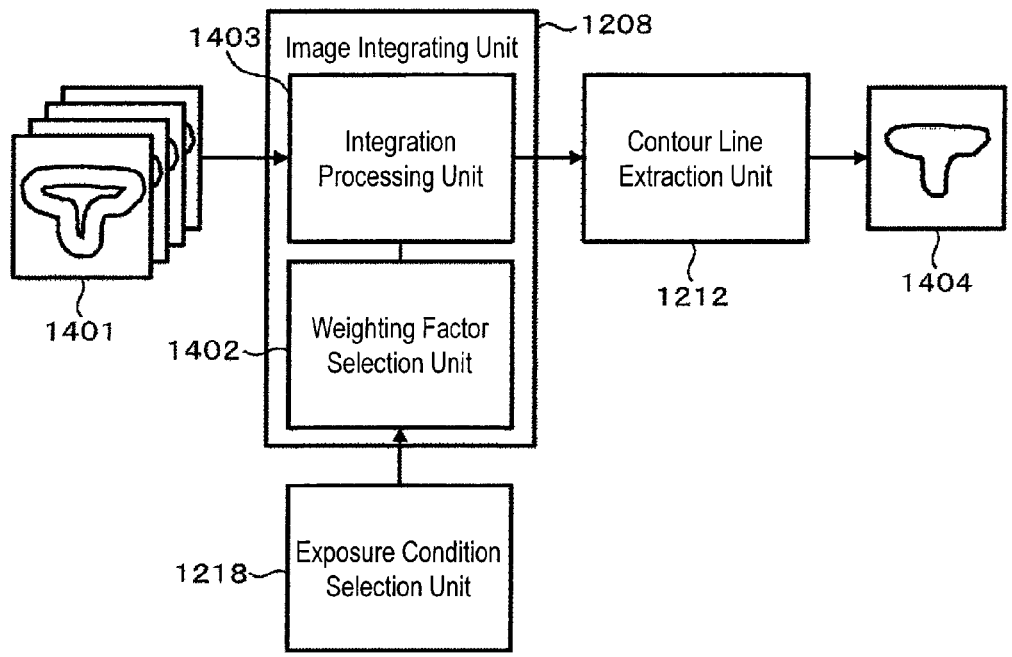
FIG. 14 is a diagram illustrating the steps of integrating SEM images of patterns created under different manufacturing conditions.
Figure 15:
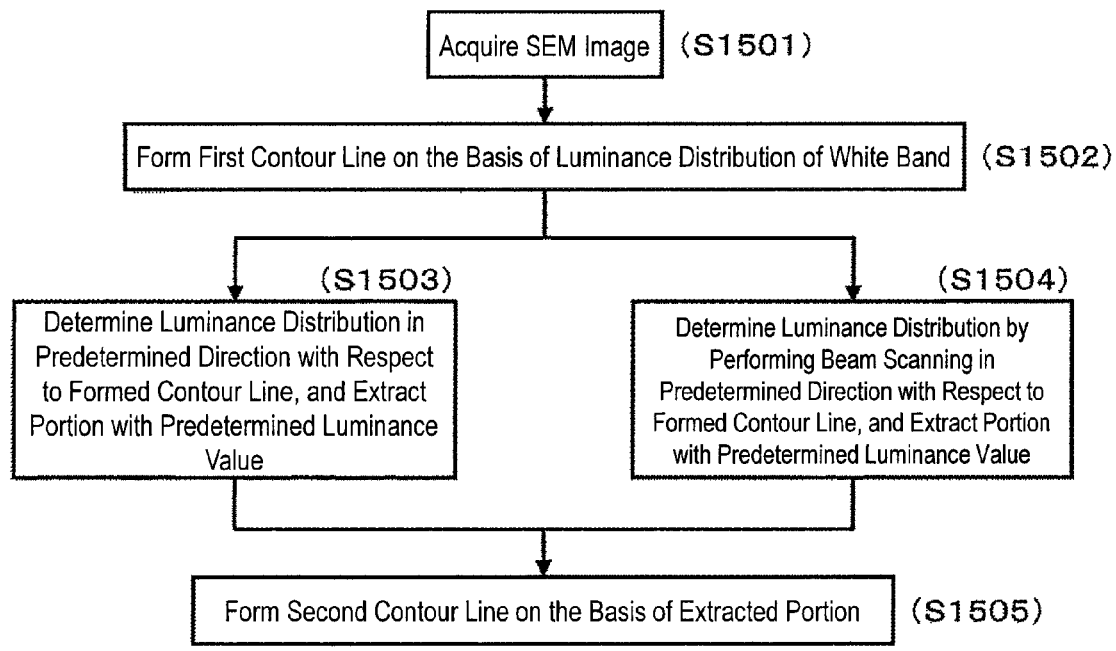
FIG. 15 is a flowchart showing the steps of creating a contour line.

The contour line extraction unit 1212 extracts a contour line from image data in accordance with a flowchart exemplarily shown in FIG. 13, for example. FIG. 14 is a diagram showing a summary of the contour line extraction.

Figure 16:
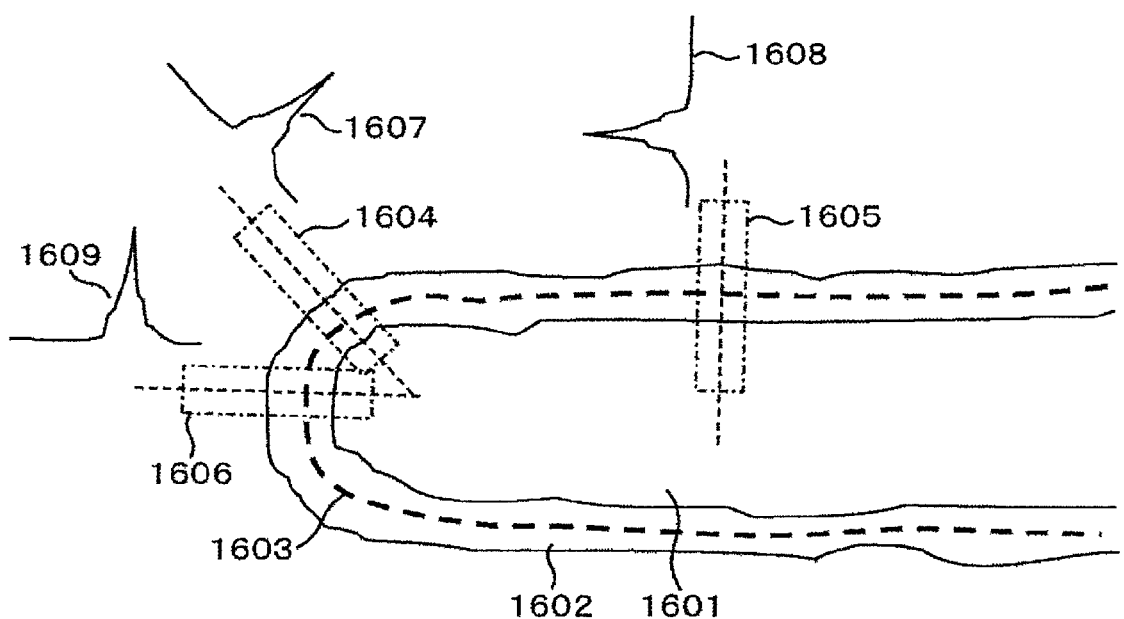
FIG. 16 is a diagram showing the principle of creating a contour line.

First, a SEM image is acquired (step 1501). Next, a first contour line is formed on the basis of a luminance distribution of a white band (step 1502). Herein, edge detection is performed using the white band method or the like. Next, a luminance distribution in a predetermined direction with respect to the thus formed first contour line is determined, and a portion with a predetermined luminance value is extracted (step 1503). The predetermined direction herein is desirably a direction that is perpendicular to the first contour line. As exemplarily shown in FIG. 16, a first contour line 1603 is formed on the basis of a white band 1602 of a line pattern 1601, and luminance distribution acquisition regions (1604 to 1606) are set with respect to the first contour line 1603, whereby luminance distributions (1607 to 1609) in a direction perpendicular to the first contour line are acquired.

Although the first contour line 1603 is a rough contour line, it represents the general shape of a pattern. Thus, in order to form a contour line with higher precision with reference to the contour line, luminance distributions are detected with reference to the contour line. When luminance distributions in a direction perpendicular to the contour line are detected, the peak widths of the profile can be narrowed, and it thus becomes possible to detect accurate peak positions and the like. For example, when the peak top positions are joined together, for example, it becomes possible to form a contour line with higher precision (i.e., a second contour line) (step 1505). Alternatively, it is also possible to from a contour line by not detecting the peak tops but joining portions with predetermined luminance together.

Further, in order to form the second contour line, it is also possible to form a profile by causing an electron beam to scan in a direction perpendicular to the first contour line 1603 (step 1604) and form a second contour line on the basis of the profile.

Figure 10:
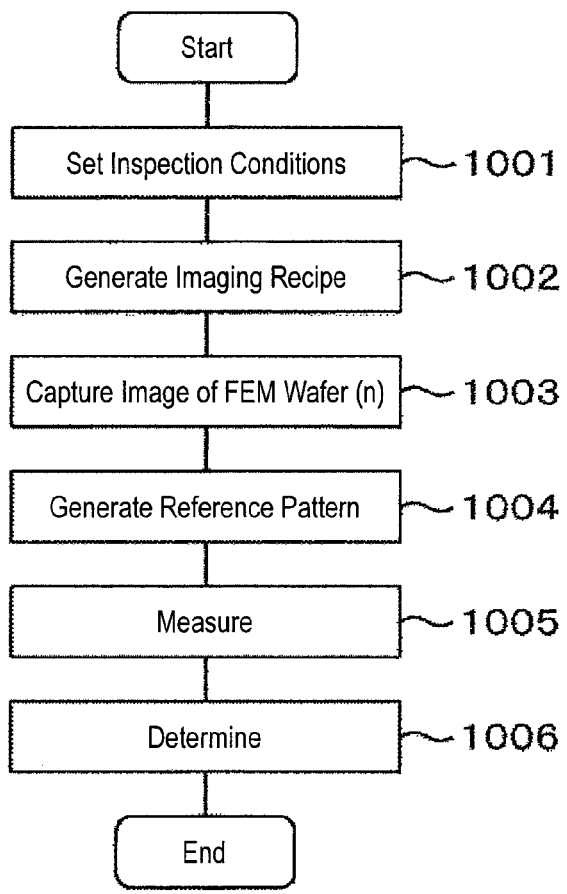
FIG. 10 is a flowchart showing the steps of measuring a semiconductor.

FIG. 10 is a flowchart showing the steps of measuring a semiconductor pattern. This embodiment will describe an example in which measurement of a semiconductor is applied to the operation of identifying a process window that is performed in verifying a lithography process. The process window refers to the range of the conditions of an exposure apparatus that can manufacture non-defective circuit patterns.

The process window is typically identified using dimension values obtained by measuring line patterns. However, this embodiment will describe an example in which a circuit pattern obtained under a best exposure condition is compared as a reference pattern with each of circuit patterns on a FEM (Focus Exposure Matrix) wafer described below to identify a non-defective pattern from the results of comparison, and the range of the manufacturing conditions of the identified circuit pattern is used to identify the process window.

A FEM wafer is a wafer for analyzing the process window. A FEM wafer has a plurality of circuit patterns formed thereon at predetermined intervals that have been manufactured by changing the focus amount and dose amount of the exposure apparatus in stages.

First, an operator sets the inspection conditions for imaging and measuring the circuit patterns on the FEM wafer using the imaging recipe creation device 212 (step 1001). The inspection conditions include the imaging magnification of the SEM 201, the coordinates of a circuit pattern to be inspected (hereafter referred to as inspection coordinates), and the like.

Next, an imaging recipe is generated on the basis of the set inspection conditions (step 1002). The imaging recipe is the data for controlling the SEM 201, and has defined therein the inspection conditions set by the inspection operator and a template for identifying the inspection position from a captured image. Next, a circuit pattern is imaged with the SEM 201 on the basis of the recipe, and pattern matching is performed using the template for positioning, so that a point to be inspected in the captured image is identified (step 1003).

After a circuit pattern to be inspected is imaged, a reference pattern is generated (step 1004). A flowchart in FIG. 1 shows the procedures to generate a reference pattern. First, a plurality of pieces of image data obtained under different manufacturing conditions are analyzed, and a best condition to be a reference condition to identify the process window is determined (step 101). Next, image data on a plurality of circuit patterns manufactured under conditions that are close to the best condition is determined (step 102). Finally, a reference pattern is generated using the best condition and the image data on the plurality of circuit patterns (step 103). Hereinafter, steps 101 to 103 will be specifically described.

(Determination of the Best Condition of the Manufacturing Apparatus (Step 101))

Figure 4:
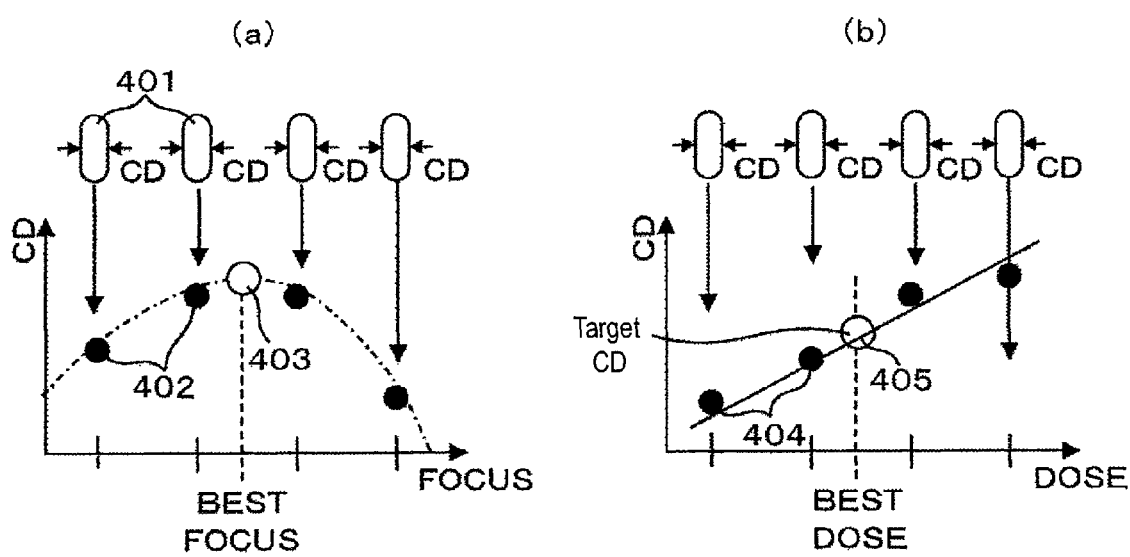
FIG. 4 are illustration diagrams of a best condition determination method that uses measurement of dimensions.

A best condition refers to an optimal condition of each of the focus amount and the dose amount (best focus and best dose). A method of determining a best focus from the CD value of a circuit pattern (i.e., the dimension value of the circuit pattern) will be described with reference to FIG. 4(*a*). First, the dimension values (CD) of circuit patterns 401 created with different focus amounts are measured by the one-dimensional dimension measuring unit 1211 using a CD-SEM, and dimension values 402 of the circuit patterns are plotted on a graph. Next, the exposure condition selection unit 1218 performs curve fitting and determines the peak position of the curve. The focus condition at the peak position is determined to be a best focus 403. The number of circuit patterns that can be manufactured on a FEM wafer is limited, and the individual circuit patterns have fluctuations in shape. Thus, it is also possible to determine the best focus through estimation by combining the measurement results of circuit patterns, which have been manufactured by changing the focus amount in steps of several μm, and curve fitting. A focus point that satisfies a predetermined condition as described above is determined to be the best focus point.

Next, a method of determining a best dose will be described with reference to FIG. 4(b). To determine the best dose, dimension values 404 of a plurality of circuit patterns obtained by changing the dose amount at the best focus point are measured, and are plotted on a graph. When the dose amount is changed, the dimensions of the circuit patterns increase or decrease linearly. Therefore, straight line fitting of a plurality of measured CD values is performed, and a dose condition 405 that corresponds to the CD value of the manufacturing target is determined to be the best dose.

Figure 5:
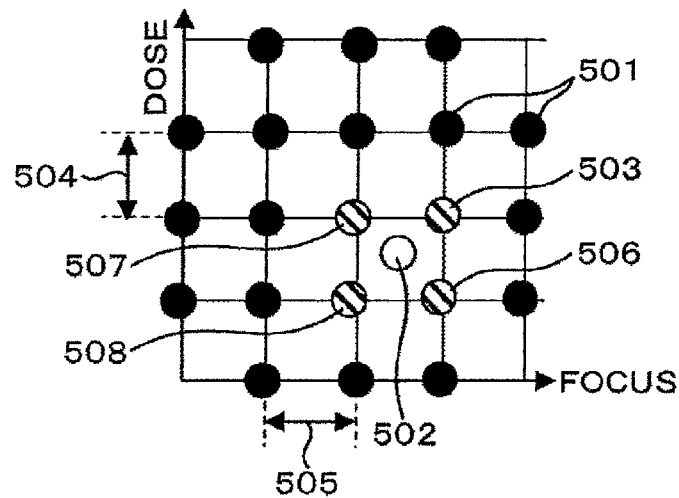
FIG. 5 is a diagram showing the positional relationship between the position of a circuit pattern group on a FEM wafer and the position of a best condition.

FIG. 5 shows the relationship between circuit patterns 501 on a FEM wafer and a best condition 502 identified through analysis of the aforementioned CD measurement results. The gap between the circuit patterns in the focus direction indicates a focus step amount 505, and the gap between the circuit patterns in the dose direction indicates a dose step amount 504. As described above, the best condition is usually determined using an approximate expression. Thus, it is often the case that the best condition is not equal to the manufacturing condition of a manufactured circuit pattern. In this embodiment, the best condition is determined through fitting or the like. Thus, appropriate exposure conditions can be extracted without preparing finely divided steps.

(Determination of a Circuit Pattern Group Created Under Conditions that are Close to the Reference Condition (Step 102))

Next, the exposure condition selection unit 1218 determines a circuit pattern group to be used to generate a reference pattern. The circuit pattern group refers to a plurality of circuit patterns 503, 506, 507, and 508 manufactured under conditions that are close to the best condition as shown in FIG. 5. Although the example in FIG. 5 shows a case where images obtained at four measurement points are selected, it is also possible to, if the best condition 502 is located at a midpoint on a straight line that connects the pattern 507 and the pattern 508, select the patterns 507 and 508. Alternatively, conditions that are close to the best condition may be selected by, for example, selecting a predetermined number of manufacturing conditions that are adjacent to the best condition, or selecting a manufacturing condition that is included in a predetermined range of manufacturing conditions having the best condition at the center. As described above, manufacturing conditions that satisfy a predetermined condition are selected.

(Generation of a Reference Pattern (Step 103))

Next, a reference pattern under the best condition for use in measurement of a circuit pattern is generated on the basis of the plurality of circuit patterns and information on the best condition. In this example, a case will be described in which a focus condition (f1) of a manufactured circuit pattern is equal to the best focus, and the best dose is located between two points (d1,d2) of the dose conditions of the manufactured circuit patterns. In the case of the FEM wafer exemplarily shown in FIG. 5, for example, the best focus is located at the same position as the patterns 507 and 508, and the best dose is located between the patterns 507 and 508.

Figure 3:
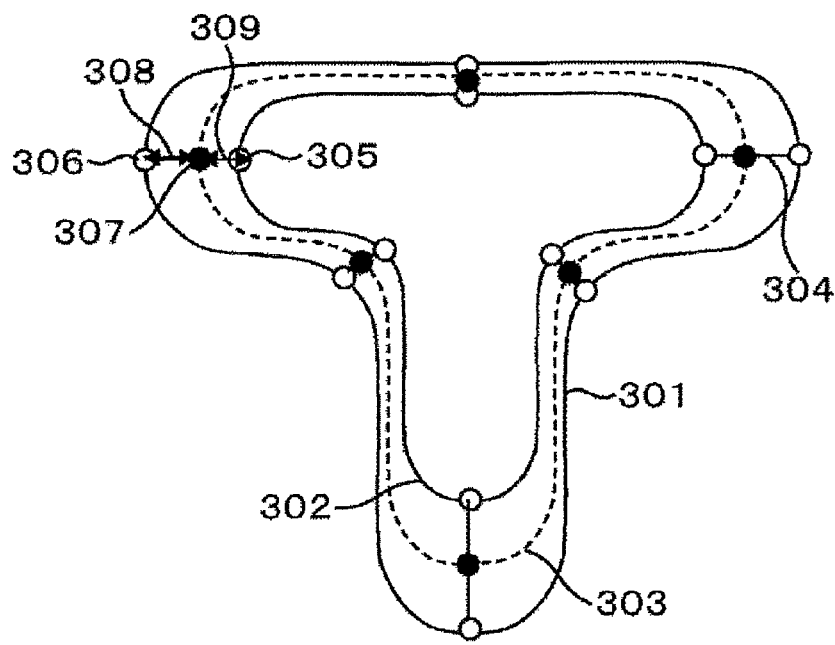
FIG. 3 is a diagram showing an example of a reference pattern that is formed on the basis of data on a plurality of patterns created under different manufacturing conditions.

In the case of the aforementioned condition, a reference pattern of the best condition is generated using circuit patterns at two points manufactured under a manufacturing condition A (f1,d1) and a manufacturing condition B (f1,d2), respectively. FIG. 3 shows a circuit pattern 302 of the manufacturing condition A and a circuit pattern 301 of the manufacturing condition B. From the two circuit patterns, a reference pattern 303 of the best condition indicated by a dashed line is generated. The matching processing unit 1210 performs matching between data on the circuit pattern 301 and data on the circuit pattern 302, and associates an edge point 305 of the circuit pattern 302 of the manufacturing condition A with an edge point 306 of the circuit pattern 301 of the manufacturing condition B, and then sets an edge point of a reference pattern on a straight line that connects the respective edge points. Association of the edge points can be determined by, for example, searching for an association target edge that is closest to an association source edge. Alternatively, association of the edge points can also be determined by searching for an association target edge point that is located in the direction of the normal to the association source edge.

The edge point of the reference pattern is determined on the basis of errors of the dose amount and the focus amount of the manufacturing condition A with respect to the best dose and the best focus, and errors of the dose amount and the focus amount of the manufacturing condition B with respect to the best dose and the best focus. Specifically, when the best dose is located at a midpoint between the manufacturing condition A and the manufacturing condition B, a center position 307 between the edge point 305 of the circuit pattern 302 of the manufacturing condition A and the edge point 306 of the circuit pattern 301 of the manufacturing condition B is determined to be the edge point of the reference pattern. Alternatively, when the best dose is located at a point of a distance of 4:6 between the manufacturing condition A and the manufacturing condition B, a point at a position of 4:6 of a straight line that connects the edge point 305 of the circuit pattern 302 of the manufacturing condition A and the edge point 306 of the circuit pattern 301 of the manufacturing condition B is determined to be the edge point of the reference pattern.

As described above, a reference pattern is generated on the basis of an error of the manufacturing condition of each of circuit patterns with respect to the best condition and the edge position of each of a plurality of manufactured circuit patterns.

Although the above example illustrates a case where the best condition coincides with the best focus, it is also possible to, even when neither the best focus nor the best dose coincides with the manufacturing condition as in FIG. 5, generate a reference pattern of a best condition by using circuit patterns of manufacturing conditions at 4 or 16 points that surround the best condition, and performing a process of interpolating edge positions of the respective circuit patterns using weights that are based on errors of the manufacturing conditions with respect to the best condition. Alternatively, it is also possible to, when the difference between the best condition and the manufacturing condition of the actual pattern is small (i.e., when the dimension difference is less than or equal to a predetermined value, for example), and the manufacturing condition of the actual pattern can be substantially regarded as the best condition, use the already acquired image as the reference pattern.

Various methods have been proposed as the method for determining a single coordinate point by performing an interpolation process using a plurality of coordinate points and weighting factors. Thus, the present invention is not limited to the aforementioned method. Such determination of an edge point of a reference pattern is performed on the entire circuit patterns to generate the reference pattern.

Next, the generated reference pattern of the best condition is compared with each of a plurality of circuit patterns created under different manufacturing conditions to measure an error in shape (1005). The measured value herein is a value that is based on the gap between edge points of the reference pattern and each of the circuit patterns. The measured value may be the value of an error in shape at a single edge point or a statistical value of errors in shape at a plurality of consecutive edge points.

Figure 9:
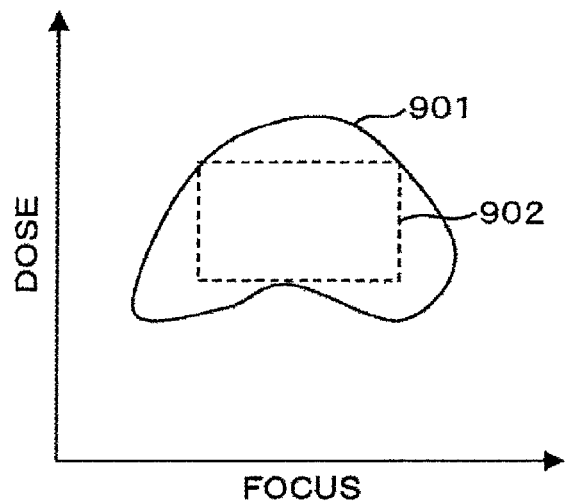
FIG. 9 is a diagram showing an exemplary process window of a semiconductor manufacturing apparatus.

Next, the measured value is compared with the tolerable shape error amount to identify a non-defective circuit pattern and thereby identify the process window (1006). FIG. 9 shows an exemplary process window. This is an example in which the maximum rectangle, which can be set in a range 901 of manufacturing conditions under which non-defective circuit patterns are manufactured, is defined as a process window 902. Displaying such process window 902 on a display 211 allows an inspection operator to visually check the measurement results.

Although an example has been described in which a reference pattern is created mainly on the basis of contour line data, the reference pattern may also be created using SEM image data instead of the contour line data. FIG. 14 is a diagram showing the steps of creating a reference pattern on the basis of SEM image data. A SEM image group 1401 includes, for example, SEM images of the circuit patterns 501, 503, 507, and 508 exemplarily shown in FIG. 5. As in the case where a reference pattern is created on the basis of contour line data, the best condition 502 is determined by, after acquiring the SEM images, measuring the patterns created under different manufacturing conditions with the one-dimensional dimension measuring unit 1211 or the like. The exposure condition selection unit 1218 or the like transmits position information on the best condition 502 to a weighting factor selection unit 1402 of the image integrating unit 1208. Then, the weighting factor selection unit 1402 sets a weighting factor for an integrating process for each SEM image in accordance with the position of the best condition.

When a reference pattern is formed on the basis of the contour line data, position information on the best condition is used to determine the position of a point between corresponding points of a plurality of contour lines, while when a reference pattern is formed on the basis of SEM image data, position information on the best condition is used to determine a weighting factor for integrating a plurality of pieces of image data. In this case, a factor is selected so that a greater weight is assigned to a SEM image whose condition is close to the best condition. Such a factor may be obtained by referring to a database that has stored therein the position of the best condition and the factor in association with each other, or by preparing in advance a related expression of a weighting factor and the position of the best condition and performing an operation using the related expression.

An integration processing unit 1403 performs a process of integrating images by reflecting a weighting factor assigned to each image data as described above. As an integrated image is created using the ratio corresponding to the position of the best condition, a pattern image that is close to the best condition can be created.

The integrated image created as described above is converted into contour line data with the contour line extraction unit 1212 as needed, and is stored as a reference pattern 1404 in a predetermined storage medium (e.g., memory 1209).

FIG. 13 is a flowchart showing the steps of generating a reference pattern on the basis of SEM image data or contour line data. A FEM wafer is introduced into a sample chamber of an electron microscope, and measurement of a predetermined pattern is executed for each of regions of different exposure conditions (steps 1301, 1302). Upon termination of the measurement of a predetermined target pattern, a best condition is selected through fitting or the like as describe above (step 1303). At this time, if the best condition is substantially equal to the manufacturing condition of a pattern on the wafer (e.g., if the dimensions of a pattern that can be estimated to have been created under the best focus condition is equal to the dimensions of a pattern on the wafer), a reference pattern is created on the basis of the image data or contour line data on the pattern (step 1305). Meanwhile, if there is a discrepancy between the best condition and the manufacturing condition of a pattern that is actually formed on the FEM wafer, a reference pattern is created on the basis of image or contour line data on a plurality of patterns generated under different manufacturing conditions (steps 1304, 1305).

The reference data generated as described above is registered in a recipe so as to be applied to the subsequent measurements (step 1307).

Embodiment 2

Although Embodiment 1 uses the CD value to determine the best condition, there are cases where the CD values of two-dimensional circuit patterns with complicated shapes cannot be correctly measured. This embodiment will describe a method of determining the process window based on a shape deformation of a two-dimensional circuit pattern. It should be noted that measurement and determination processes that are performed after the best condition is determined are the same as those in Embodiment 1. Thus, description thereof will be omitted.

Figure 6:
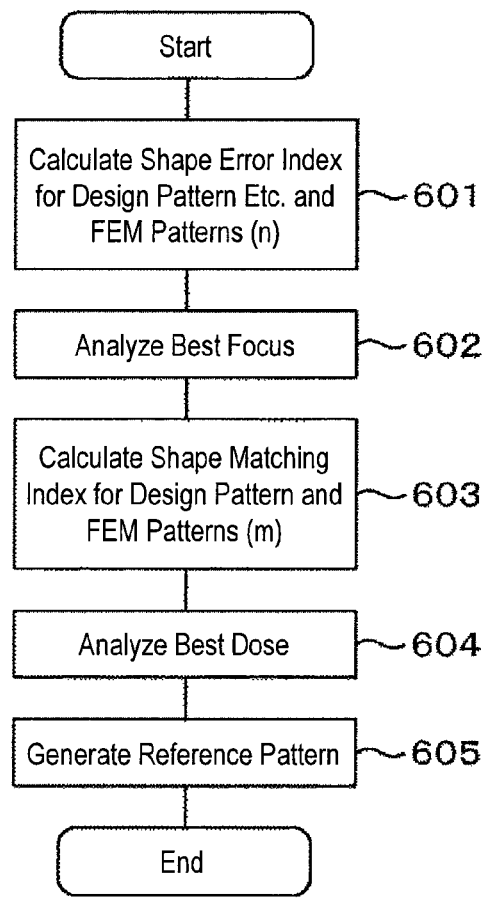
FIG. 6 is a flowchart showing the steps of generating a reference circuit pattern.

FIG. 6 is a flowchart showing the steps of generating a reference pattern under a best condition using a design pattern. It should be noted that it is also possible to use, other than the design pattern, a simulation pattern obtained through an optical simulation, which correctly shows the shape of a target to be manufactured, or a golden pattern.

Figure 7:
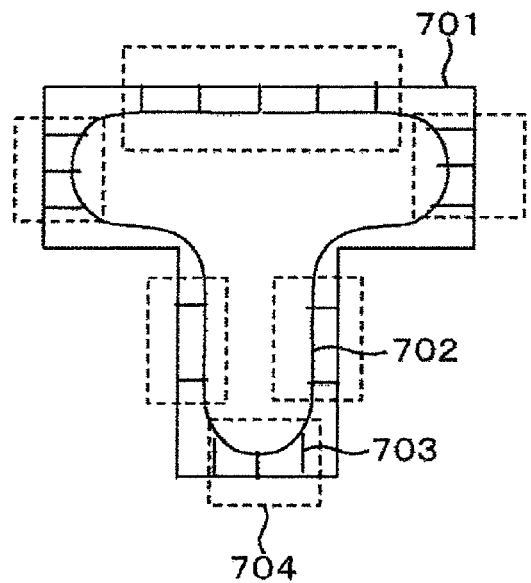
FIG. 7 is a diagram showing measured points when a shape error amount is determined on the basis of design data and circuit pattern data.

First, a shape error index for a design pattern and each of circuit patterns on a FEM is calculated (601). A shape error corresponds to an error amount 703 between edge points of a design pattern 701 and a circuit pattern 702 as shown in FIG. 7. The shape error index is a value indicating the shape error amount between a design pattern and a circuit pattern, such as the average value of errors between edge points included in the measurement region, or the maximum value and the minimum value of errors included in the measurement region. It should be noted that the design data is line drawing data obtained by converting information such as GDS data, which is common vector data, into a line drawing.

However, as the shape of a corner portion of a design data and the shape of a corner portion manufactured on a wafer originally differ, the shape error index is calculated by setting a portion excluding the corner portion as a shape index calculation region 704. A calculation region for such a shape error index can be set by an inspection operator using the display 211 having an input means. In addition, it is also possible to reduce the aforementioned operation burden on the inspection operator by automatically determining a calculation area for a shape error index excluding a corner portion by analyzing the design pattern on the basis of a rule that determines a region from the apex of the design pattern to a portion within several nanometers from the apex as a corner. It should be noted that a shape error is calculated by changing the sign of the error amount between a case where an edge of a circuit pattern is located in the design pattern and a case where an edge of a circuit pattern is located outside the design pattern.

Figure 8:
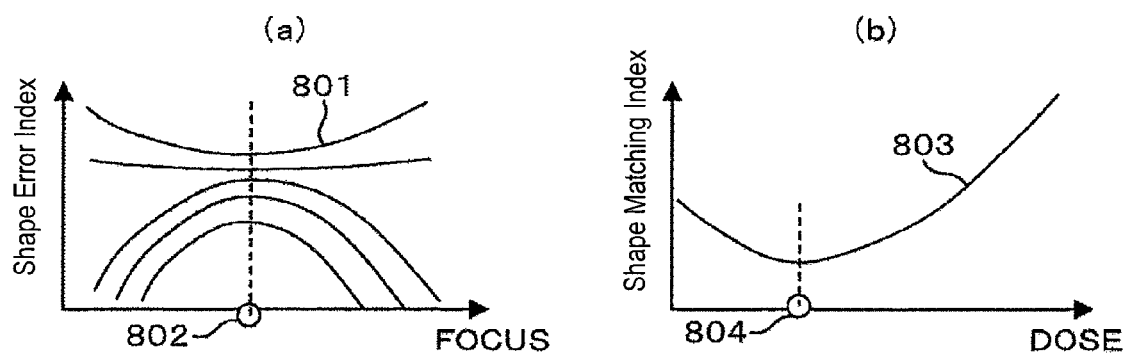
FIG. 8 are diagrams each showing an exemplary graph showing the relationship between a manufacturing condition and a shape error index.

FIG. 8(a) shows an example in which a shape error index (i.e., average error in the measurement region) for each of circuit patterns on a FEM wafer is represented in a graph through approximate curve fitting. A result of drawing a parabola in the focus direction can be obtained. The peak position of the parabola is determined to be the best focus position for a two-dimensional circuit pattern (602).

Next, with respect to a plurality of circuit patterns with different dose amounts at the best focus point, comparison is made between the design pattern and each of the circuit patterns to calculate a shape matching index (603). The shape matching index is also a value that is based on the error amount 703 between edge points of the design pattern 701 and the circuit pattern 702 as with the shape error index, and corresponds to, for example, the average value of errors between the edge points included in the measurement region, the maximum value and the minimum value thereof, and the like.

It should be noted that the error amount is calculated without signs, without distinguishing a case where an edge of a circuit pattern is present in the design pattern and a case where an edge of a circuit pattern is present outside the design pattern. In addition, as in the case of identifying the best focus, the shape matching index is also calculated by setting a portion excluding a corner as a measurement target.

FIG. 8(b) is an example in which a shape matching index for each of a plurality of circuit patterns with different dose amounts at the best focus is represented in a graph through approximate curve fitting. A result of drawing a parabola in the dose direction can be obtained. The peak position of the parabola, that is, a point with the minimum shape error with respect to the design pattern is determined to be the best dose for a two-dimensional circuit pattern (604).

Finally, a reference pattern is generated with the method described in Embodiment 1 using the best condition determined as above and a plurality of circuit patterns created under conditions that are close to the best condition (605).

Although this embodiment shows an example in which the best dose is identified after the best focus is identified first, it is also possible to identify the best dose first using the aforementioned method, and then identify the best focus at the best dose point using the aforementioned method.

Figure 11:
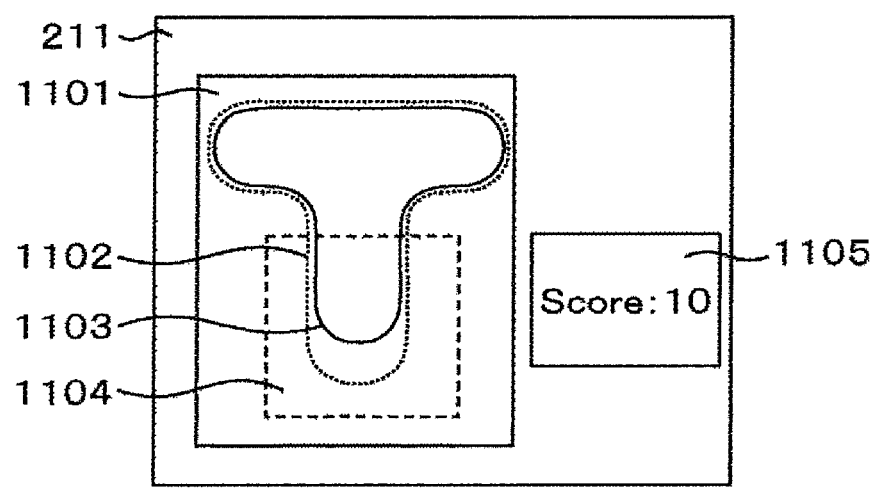
FIG. 11 is a diagram showing an exemplary display of inspection results.

In addition, as shown in FIG. 11, when a window 1101 for overlaying a reference circuit pattern 1102 and a circuit pattern 1103 described above one on top of the other, a measured value 1105 obtained by comparing the circuit pattern 1103 with the reference circuit pattern 1102, a measurement region 1104, and the like are displayed on the display 211, an inspection operator is able to promptly check the progress of the inspection and the inspection results.

REFERENCE SIGNS LIST

201 SEM
202 Electron beam
203 Sample
204 Secondary electron detector
205 Reflected electron detector 1
206 Reflected electron detector 2
207 A/D converter
208 Memory
209 CPU
210 Image processing hardware
211 Display
212 Imaging recipe creation device
213 Design data
301, 302, 401, 501, 503, 702, 1103 Circuit pattern
303 Reference pattern
304 Straight line between corresponding edge points
305, 306 Edge point
307 Center position
308 Difference between manufacturing condition B and reference condition
309 Difference between manufacturing condition A and reference condition
402, 404 Dimension value of circuit pattern
403 Best focus
405 Dose condition
502 Best condition
504 Dose step amount
505 Focus step amount
701 Design pattern
703 Error amount between edge points
704 Shape index calculation region
801 Approximate curve in focus direction
802 Best focus point
803 Approximate curve in dose direction
804 Best dose point
901 Range of manufacturing conditions
902 Process window
1101 Window for overlaying reference circuit pattern and circuit pattern one on top of the other
1102 Reference circuit pattern
1104 Measurement region
1105 Measurement result window

The invention claimed is:

1. A pattern measuring device comprising:
an arithmetic processing unit including processing circuitry and a non-transitory memory storing at least one of image data and contour line data formed based on an output of a charged particle beam device, and a program that, when executed by the processing circuitry, causes the processing circuitry to:
acquire or generate the image data or the contour line data of a plurality of circuit patterns created under different manufacturing conditions of an exposure apparatus;
determine a plurality of measured values of the circuit patterns for each exposure condition, using the image data or contour line data of different exposure conditions;
calculate a function representing a relationship between the measured values and each exposure condition based on the measured values of each exposure condition; and
generate reference data to be used for measurement of a circuit pattern by setting a pattern edge based on an edge position determined for different positions of the pattern;
wherein the arithmetic processing unit, using the image data or the contour line data on a plurality of circuit patterns created under different combinations of a focus condition and a dose condition of the exposure apparatus, measures dimensions of the plurality of circuit patterns, determines a best focus condition and a best dose condition on the basis of measurement results of the dimensions of the plurality of circuit patterns, and changes an edge position of the contour line data in accordance with positions of the best focus condition and the best dose condition on a focus map and a dose map.

2. The pattern measuring device according to claim 1, wherein the arithmetic processing unit, based on measurement results of dimensions of the image data or the contour line data on the plurality of circuit patterns, selects a plurality of manufacturing conditions that satisfy predetermined conditions, and generates the reference data from the image data or the contour line data on a plurality of patterns formed under the manufacturing conditions.

3. The pattern measuring device according to claim 2, wherein the arithmetic processing unit, based on measurement results of the dimensions of the image data or the contour line data on the plurality of circuit patterns, selects one of the manufacturing conditions that satisfies one of the predetermined conditions, and generates the reference data from the image data or the contour line data on a predetermined number of patterns or on patterns in a predetermined range that have been created under conditions that are close to the selected one of the manufacturing conditions that satisfies the one of the predetermined conditions.

4. The pattern measuring device according to claim 1, wherein the arithmetic processing unit, based on measurement results of dimensions of the image data or the contour line data on the plurality of circuit patterns, generates or selects contour line data on patterns formed under manufacturing conditions that are close to a selected manufacturing condition, determines corresponding points of two contour lines of the contour line data, and sets an edge point at a position, corresponding to the selected manufacturing condition, between the corresponding points.

5. The pattern measuring device according to claim 1, wherein the arithmetic processing unit, based on a measurement result of a shape difference between the image data or the contour line data on each of the plurality of circuit patterns and figure data that is based on design data, selects a plurality of manufacturing conditions that satisfy a predetermined condition, and generates the reference data from the image data or the contour line data on a plurality of patterns formed under the plurality of manufacturing conditions.

6. The pattern measuring device according to claim 1, wherein the arithmetic processing device, based on a measurement result of a shape difference between the image data or the contour line data on each of the plurality of circuit patterns and figure data that is based on design data, selects a manufacturing condition that satisfies a predetermined condition, and generates the reference data from the image data or the contour line data on a predetermined number of patterns or on patterns in a predetermined range, the predetermined number of patterns or the patterns in the predetermined range having been created under conditions that are close to the selected manufacturing condition that satisfies the predetermined condition.

7. The pattern measuring device according to claim 1, wherein the arithmetic processing unit, using image data or contour line data on a plurality of circuit patterns created under different combinations of a focus condition and a dose condition of the exposure apparatus, measures a shape difference between the image data or the contour line data on each circuit pattern and design data, determines the best focus condition and the best dose condition on the basis of a measurement result of the shape difference of each of the plurality of circuit patterns, and changes an edge position of the contour line data in accordance with positions of the best focus condition and the best dose condition on a focus map and a dose map.

8. The pattern measuring device according to claim 1, wherein the arithmetic processing unit, based on a measurement result of a shape difference between the image data or the contour line data on each of the plurality of circuit patterns and figure data that is based on design data, generates or selects contour line data on patterns formed under at least two manufacturing conditions that are close to a selected manufacturing condition, determines corresponding points of two contour lines of the contour line data, and sets an edge point at a position corresponding to the selected manufacturing condition, between the corresponding points.

9. The pattern measuring device according to claim 1, wherein the arithmetic processing unit performs measurement of a shape difference between the image data or the contour line data on each of the plurality of circuit patterns and figure data that is based on design data at a portion other than a region including a corner portion of each circuit pattern, and generates the reference data based on the measurement of the shape difference.

10. The pattern measuring device according to claim 1, wherein the arithmetic processing unit generates contour line data on a plurality of circuit patterns created under different manufacturing conditions of a manufacturing apparatus, and determines an edge point on the basis of a difference between a manufacturing condition of a pattern indicated by the contour line data and a manufacturing condition determined on the basis of the contour line data, at a position between corresponding points of contour lines of the contour line data.

11. The pattern measuring device according to claim 10, wherein the arithmetic processing unit determines the edge point by performing an interpolation operation in accordance with the difference.

12. The pattern measuring device according to claim 1, wherein the arithmetic processing unit measures a shape error amount by comparing the reference data with a shape of each of the circuit patterns created under the different manufacturing conditions.

13. The pattern measuring device according to claim 12, wherein the arithmetic processing unit identifies if a pattern is non-defective based on comparison between the shape error amount and a predetermined tolerable error amount.

14. The pattern measuring device according to claim 1, wherein the arithmetic processing unit determines a process window of an exposure apparatus based on comparison between the reference data and each of the plurality of circuit patterns created under the different manufacturing conditions.

15. A semiconductor measuring system comprising:
a charged particle beam device configured to form an image obtained by irradiating a sample with a charged particle beam; and
an arithmetic processing unit including processing circuitry and a non-transitory memory storing at least one of image data and contour line data formed based on an output of the charged particle beam device, and a program that, when executed by the processing circuitry, causes the processing circuitry to:
acquire or generate the image data or the contour line data of a plurality of circuit patterns created under different manufacturing conditions of an exposure apparatus;
determine a plurality of measured values about plural positions of the circuit patterns for each exposure condition, using the image data or contour line data of different exposure conditions;

calculate a function representing a relationship between the measured values and each exposure condition based on the measured values of each exposure condition; and generate reference data to be used for measurement of a circuit pattern by setting a pattern edge based on an edge position determined for different positions of the pattern;

wherein the arithmetic processing unit, using the image data or the contour line data on a plurality of circuit patterns created under different combinations of a focus condition and a dose condition of the exposure apparatus, measures dimensions of the plurality of circuit patterns, determines a best focus condition and a best dose condition on the basis of measurement results of the dimensions of the plurality of circuit patterns, and changes an edge position of the contour line data in accordance with positions of the best focus condition and the best dose condition on a focus map and a dose map.

* * * * *